United States Patent
Shin

(10) Patent No.: US 7,365,583 B2
(45) Date of Patent: Apr. 29, 2008

(54) DELAY LOCKED LOOP FOR HIGH SPEED SEMICONDUCTOR MEMORY DEVICE

(75) Inventor: Beom-Ju Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 15 days.

(21) Appl. No.: 11/528,633

(22) Filed: Sep. 28, 2006

(65) Prior Publication Data

US 2007/0069782 A1 Mar. 29, 2007

(30) Foreign Application Priority Data

Sep. 28, 2005 (KR) .................... 10-2005-0090842
Jun. 22, 2006 (KR) .................... 10-2006-0056408

(51) Int. Cl.
*H03L 7/06* (2006.01)

(52) U.S. Cl. ...................... 327/158; 327/149

(58) Field of Classification Search ............... None
See application file for complete search history.

(56) References Cited

U.S. PATENT DOCUMENTS

| | | | |
|---|---|---|---|
| 6,011,732 A | 1/2000 | Harrison et al. | |
| 6,492,852 B2 * | 12/2002 | Fiscus | 327/158 |
| 6,498,524 B1 * | 12/2002 | Kawasaki et al. | 327/158 |
| 6,552,955 B1 * | 4/2003 | Miki | 365/233 |
| 6,768,690 B2 * | 7/2004 | Kwon et al. | 365/194 |
| 6,813,197 B2 | 11/2004 | Park | |
| 6,927,612 B2 * | 8/2005 | Meyer | 327/156 |
| 6,954,094 B2 | 10/2005 | Lee et al. | |
| 6,954,095 B2 | 10/2005 | Lau et al. | |
| 7,027,352 B2 * | 4/2006 | Jung | 365/233 |
| 7,039,147 B2 | 5/2006 | Donnelly et al. | |
| 7,282,978 B2 * | 10/2007 | Lee | 327/175 |
| 7,298,189 B2 * | 11/2007 | Kang et al. | 327/158 |
| 2003/0076143 A1 * | 4/2003 | Nishimura et al. | 327/158 |
| 2003/0081491 A1 * | 5/2003 | Miki | 365/233 |
| 2006/0171497 A1 | 8/2006 | Kim et al. | |

FOREIGN PATENT DOCUMENTS

| | | |
|---|---|---|
| JP | 2005-323323 | 11/2005 |
| JP | 2005-332548 | 12/2005 |

* cited by examiner

*Primary Examiner*—Cassandra Cox
(74) *Attorney, Agent, or Firm*—McDermott Will & Emery LLP

(57) ABSTRACT

A delayed locked loop supports increased operation frequency in a semiconductor memory device. An output driver for use in a delay locked loop includes a first driving block for receiving an output from the delay locked loop to generate a first DLL clock for outputting read data corresponding to a read command, and a second driving block for receiving an output from the delay locked loop to generate a second DLL clock for reducing current consumption during a write operation, wherein the first driving block has larger delay amount than the second driving block.

30 Claims, 9 Drawing Sheets

DELAY LOCKED LOOP FOR HIGH SPEED SEMICONDUCTOR MEMORY DEVICE

FIELD OF INVENTION

The present invention relates to a design technique for semiconductor device; and, more particularly, to a semiconductor memory device such as a double data rate synchronous dynamic random access memory such as DDR/DDR2/DDR3 SDRAMs using a delay locked loop (DLL). This application claims priority to Korean Patent Application No. 2006-0056408 filed on Jun. 22, 2006 and Korean Patent Application No. 2005-0090842 filed on Sep. 28, 2005.

BACKGROUND

In a high speed synchronous semiconductor memory device such as a double data rate synchronous dynamic random access memory (DDR SDRAM), a data unit is transferred (input from or output to) to other devices in synchronization with an external clock signal. That is, the high speed synchronous semiconductor memory device such as the DDR SDRAM performs an input or output operation in synchronization with not only a rising edge but also a falling edge of the external system clock signal. Typically, in a system or a circuit including a semiconductor memory, a clock signal is used as a reference signal for adjusting or controlling an operation timing or guaranteeing a high-speed operation without any error. Accordingly, for a high speed operation of the semiconductor memory device, it is required that operations thereof are synchronized with the external clock signal.

When an internal clock signal input is derived from an external clock signal is used in internal circuits, the internal clock signal is delayed and a clock skew is generated because of the internal circuits. For compensating the clock skew in order to equalize a phase of the internal clock signal with that of an external clock signal, a synchronization control circuit such as a delay locked loop (DLL) is embedded in the system or the circuit. The DLL receives an external clock signal and controls a timing of outputting data from the semiconductor memory device to thereby synchronize the timing with the external clock signal.

FIG. 1 is a block diagram of a conventional delay locked loop (DLL).

As shown, the conventional delay locked loop (DLL) includes a clock buffer 10, a delay block 30, a phase comparator 50, a delay controller 40, a delay replica model 60, a duty cycle compensator 70, and a driver 80.

The clock buffer 110 receives an external clock signal CLK and an external clock bar signal /CLK to generate internal clocks.

The delay block 30 is for delaying the internal clocks, wherein a delay amount of the delay block 30 is determined by the phase comparator 50 and the delay controller 40 determines a delay path included in the delay block 30 based on the delay amount. The delay block 30 includes at least one delay line constituted with plural unit delay cells, each including either logic NAND gates or a logic NAND gate and an inverter.

The delay controller 40 includes a logic circuit for determining a delay amount in the delay path of the delay block 30 and a bidirectional shift register for determining a direction of the delay amount.

The phase comparator 50 compares a phase of a reference clock signal REF_CLK, one of the internal clocks output from the clock buffer 10, with that of a feedback clock FBR_CLK output from the delay replica model 60 to thereby control the delay controller 40 based on the comparison result.

The delay replica model 60 delays an output of the delay block 30 by a predetermined amount estimated from a clock path and data path where data or the clock signal passes on in the semiconductor memory device. That is, the delay replica model 50 includes replica delay elements located in clock signal paths: one is from an input pin, i.e., inside of the chip, to the delay block 30, and the other is from the delay block 30 to an output pin.

The duty cycle compensator 70 is for controlling a duty ratio of clock output from the delay block 30 to thereby set 50:50 of the duty ratio.

The driver 80 receives outputs, i.e., IFBF_CLK and IFBR_CLK, of the duty cycle compensator 70 and outputs plural DLL clocks to external circuits.

FIG. 3 is a block diagram describing the driver 80 shown in FIG. 1.

As shown, the driver 80 includes a phase splitter 82, a first driving block 84, and a second driving block 86.

The first driving block 84 includes a first DLL driver 84_1 and a second DLL driver 84_2 for generating a first rising DLL clock RCLK_DLL and a first falling DLL clock FCLK_DLL. Likewise, the second driving block 86 includes a third DLL driver 86_1 and a fourth DLL driver 86_2 for generating a second rising DLL clock RCLK_DLLOE and a second falling DLL clock FCLK_DLLOE. Herein, the first driving block 84 and the second driving block 86 receives the same clock signals from the phase splitter 82, and detailed composition of the first driving block 84 is similar to that in the second driving block 86.

FIG. 4 is a schematic circuit diagram of a DLL driver, e.g., the first to fourth DLL drivers shown in FIG. 3.

The first to fourth DLL drivers 84_1, 84_2, 86_1 and 86_2 have the same elements. Referring to FIG. 4, each DLL driver includes one logic NAND gate ND and an even number of inverters, e.g., two inverters INV1 and INV2. The logic NAND gate ND receives a clock input CLKB_IN and an enable signal EN. The clock input CLKB_IN can correspond to outputs RCLK_OUT and RCLKB_OUT of the phase splitter 82 shown in FIG. 3, and the enable signal EN can be matched with driver enable signals DRV_EN and DRVOE_EN shown in FIG. 3.

FIG. 5 is a schematic circuit diagram of the phase splitter 82 shown in FIG. 3.

As shown, the phase splitter 82 includes a first circuit for generating a rising-out clock signal RCLK_OUT and a second circuit for generating a rising-out bar signal RCLKB_OUT. The first circuit includes two inverters INV82_1 and INV82_2 and two MOS option blocks MC82_1 and MC82_2, and the second circuit includes three inverters INV82_3, INV82_4 and INV82_5 and two MOS option blocks MC82_3 and MC82_4. Both the first and second circuits receive a rising delayed clock IFBR_CLK, one of delayed clocks IFBR_CLK and IFBF_CLK, through an input terminal RCLK_IN of the phase splitter 82. An input loading block 82_8 is coupled to another input terminal FCLK_IN, for receiving a falling delayed clock IFBF_CLK, the other of delayed clocks IFBR_CLK and IFBF_CLK. Though the input loading block 82_8 floats, as shown in FIG. 5, the input loading block may be connected to the first and second circuits when the falling delayed clock IFBF_CLK input through the input terminal FCLK_IN is used.

Referring to FIGS. 3 to 5, the driver 80 generates the first rising and falling DLL clocks FCLK_DLL and RCLK_DLL and the second rising and falling DLL clocks FCLK_DL-LOE and RCLK_DLLOE, wherein the first rising and falling DLL clocks FCLK_DLL and RCLK_DLL and the second rising and falling DLL clocks FCLK_DLLOE and RCLK_DLLOE have the same delay amount. Because the first to fourth DLL drivers have the same elements, rising edges of the first rising DLL clock RCLK_DLL and the second rising DLL clock RCLK_DLLOE occur at the same time; likewise, falling edges of the first falling DLL clock FCLK_DLL and the second falling DLL clock FCLK_DLLOE occur at the same time.

A DLL is generally used during only read operation of a semiconductor memory device. However, in the conventional DLL shown in FIG. 1, the first rising and falling DLL clocks FCLK_DLL and RCLK_DLL are used during the read operation for outputting data in response to a read command, and the second rising and falling DLL clocks FCLK_DLLOE and RCLK_DLLOE are used during a write operation for generating plural read control signals controlling blocks or circuits in a read path of data during the write operation to thereby reduce current consumption during the write operation.

FIG. 6 is a schematic circuit diagram of a data output clock generator in a conventional semiconductor memory device.

As shown, the data output clock generator receives outputs of the conventional DLL shown in FIG. 1 and generates data output clock signals RCLK_D0 and FCLK_D0 in response to data output enable signals ROUTEN and FOUTEN. The data output clock signals RCLK_D0 and FCLK_D0 are used for outputting data from a data output buffer to external devices in synchronization with an external clock signal.

FIG. 2 is a timing diagram demonstrating operation of the conventional delay locked loop shown in FIG. 1. Hereinafter, detailed operation of the conventional DLL is described.

As above described, the first rising and falling DLL clocks FCLK_DLL and RCLK_DLL are used for outputting data in response to a read command, and the second rising and falling DLL clocks FCLK_DLLOE and RCLK_DLLOE are used for generating plural read control signals during a write operation.

The second rising and falling DLL clocks FCLK_DLLOE and RCLK_DLLOE are used in a read enable block for generating rising/falling data output enable signal ROUTEN and FOUTEN. The rising/falling data output enable signals ROUTEN and FOUTEN are for drawing the data output clock signals RCLK_D0 and FCLK_D0 from the second rising and falling DLL clocks FCLK_DLLOE and RCLK_DLLOE.

Referring to FIG. 2, the conventional DLL performs a locking operation to achieve a locking state such that rising/falling edges of the reference clock REF_CLK coincide with those of the feedback clock IFBR_CLK before a read operation of the semiconductor memory device.

The rising data output enable signal ROUTEN is generated by a rising edge of the second falling DLL clock FCLK_DLLOE; herein, there is a phase difference between the rising data output enable signal ROUTEN and the second falling DLL clock FCLK_DLLOE because of a delay. The delay should be shorter than 0.5*tCK (wherein tCK corresponds to one clock cycle). Since the data output clock signals RCLK_D0 and FCLK_D0 are generated by results of logic AND operations to each of the rising/falling data output enable signals ROUTEN and FOUTEN and each of the first rising/falling DLL clocks FCLK_DLL and RCLK_DLL respectively, malfunctions can be caused if the delay is longer than 0.5*tCK. Referring to FIG. 6, if the delay, i.e., a time gap between rising edges of the rising data output enable signal ROUTEN and the second falling DLL clock FCLK_DLLOE, is longer than 0.5*tCK, the rising data output enable signal ROUTEN is generated after a rising edge of the first rising DLL clock RCLK_DLL. In this case, after performing the logic AND operation, the data output clock signals RCLK_D0 and FCLK_D0 are not generated in a desirable time; accordingly, malfunctions occur in the semiconductor memory device.

As the operation frequency of the semiconductor memory device becomes higher, a permissible range of the delay is narrower than 0.5*tCK. For example, if an operation frequency is 1 Gbps, i.e., 1tCK=2 ns, the rising data output enable signal ROUTEN are generated within 1.0 ns (=0.5*2 ns). If an operation frequency is 1.6 Gbps, i.e., 1tCK=1.25 ns, the rising data output enable signal ROUTEN is generated within 625 ps.

Accordingly, as operation frequency becomes higher in the semiconductor memory device including the conventional DLL, an operation margin for generating the rising/falling data output enable signal ROUTEN and FOUTEN becomes less. Thus, the operation frequency of the semiconductor memory device is limited.

SUMMARY OF THE INVENTION

It is an object of the present invention to provide a delayed locked loop for supporting an increase in operation frequency in a semiconductor memory device by obtaining a sufficient operation margin for generating a data output enable signal in response to a DLL clock in a high speed operation.

In accordance with an aspect of the present invention, there is provided an output driver for use in a delay locked loop, including a first driving block for receiving an output from the delay locked loop to generate a first DLL clock for outputting read data corresponding to a read command, and a second driving block for receiving an output from the delay locked loop to generate a second DLL clock for reducing current consumption during a write operation, wherein the first driving block has larger delay amount than the second driving block.

In accordance with another aspect of the present invention, there is provided a delay locked loop, including a clock buffer for receiving an external clock to generate an internal clock, a phase updating block for comparing the internal clock with a feedback clock generated from the phase updating block to control a phase of the internal clock, a first driving block for receiving an output from the phase updating block to generate a first DLL clock for outputting read data corresponding to a read command, and a second driving block for receiving an output from the phase updating block to generate a second DLL clock for reducing current consumption during a write operation, wherein the first driving block has larger delay amount than the second driving block.

In accordance with further another aspect of the present invention, there is provided a semiconductor device, including a first driving block for splitting a phase of a first input signal to generate plural first internal signals, each having different phases with respect to each other, and outputting the plural first signals in response to a first control signal and a second driving block for delaying a second input signal and outputting the delayed signal in response to a second control signal.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a delay locked loop for use in a semiconductor memory device in accordance with specific embodiments of the present invention will be described in detail with reference to the accompanying drawings.

Figure 7:
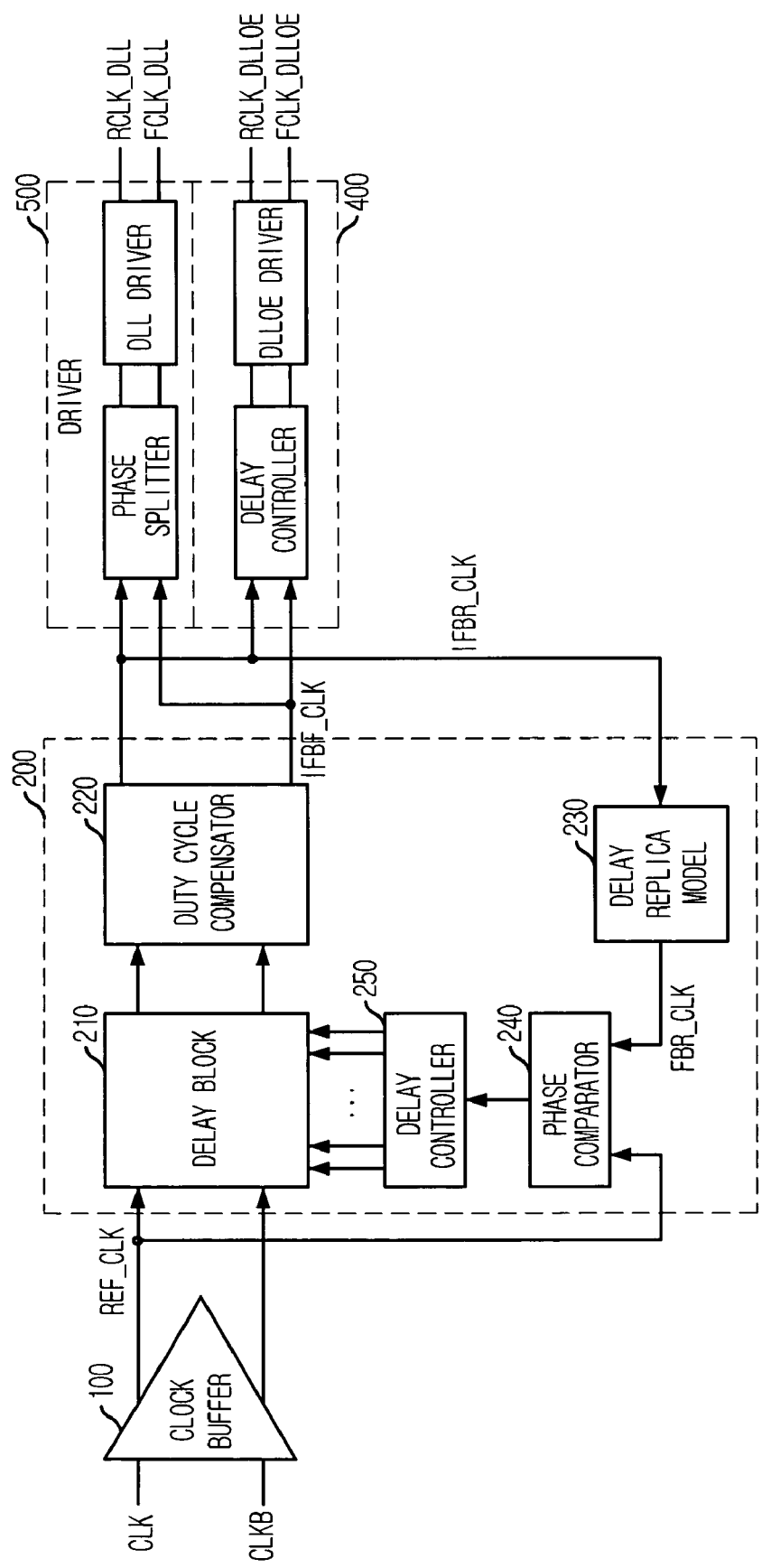
FIG. 7 is a block diagram of a delay locked loop including a driving unit in accordance with an embodiment of the present invention.

FIG. 7 is a block diagram of a delay locked loop including a driving unit in accordance with an embodiment of the present invention.

As shown, the delay locked loop includes a clock buffer 100, a phase updating block 200, a first driving block 500, and a second driving block 400. The clock buffer 100 receives external clocks CLK and CLKB to generate internal clocks. The phase updating block 200 compares a phase of the internal clocks with that of a feedback clock and updates the phase of the internal clocks. Receiving output from the phase updating block 200, the first driving block 500 generates first DLL clocks RCLK_DLL and FCLK_DLL used for outputting read data corresponding to a read command. Likewise, receiving output from the phase updating block 200, the second driving block 400 generates second DLL clocks RCLK_DLLOE and FCLK_DLLOE used for generating plural read control signals during a write operation in order to reduce current consumption. The first driving block 500 enlarges more delay amount than the second driving block 400.

In the present invention, a delay amount of the second DLL clocks RCLK_DLLOE and FCLK_DLLOE is smaller than that of the first DLL clock RCLK_DLL and FCLK_DLL; thus, a sufficient operation margin for generating rising/falling data output enable signals ROUTEN and FOUTEN in response to the second DLL clocks RCLK_DLLOE and FCLK_DLLOE can be ensured.

The phase updating block 200 includes a delay block 210, a phase comparator 240, a delay controller 250, a delay replica model 230, and a duty cycle compensator 220.

The delay block 210 is for delaying the internal clocks, wherein a delay amount of the delay block 210 is determined by the phase comparator 240 and the delay controller 250 determines a delay path included in the delay block 210 based on the delay amount. The delay controller 250 includes a logic circuit for determining a delay amount in the delay path of the delay block 210 and a bidirectional shift register for determining a direction of the delay amount. The delay comparator 240 compares a phase of a reference clock REF_CLK, one of the internal clocks output from the clock buffer 100, with that of a feedback clock FBR_CLK output from the delay replica model 230 to thereby control the delay controller 250 based on the comparison result.

The delay replica model 230 delays an output of the delay block 210 by a predetermined amount estimated from a clock path and data path where data or the clock signal passes on in the semiconductor memory device. The duty cycle compensator 220 is for controlling a duty ratio of clock output from the delay block 210 to thereby set 50:50 of the duty ratio.

In order that a phase of the second DLL clocks RCLK_DLLOE and FCLK_DLLOE can lead that of the first DLL clock RCLK_DLL and FCLK_DLL, the delay locked loop according to the present invention includes the driving unit having the first driving block 500 for generating the first DLL clocks RCLK_DLL and FCLK_DLL and the second driving block 400 for generating the second DLL clocks RCLK_DLL and FCLK_DLL. That is, a delay amount and an operational delay between the first and second driving blocks 500 and 400 are different. Herein, the term operational delay means a delay amount occurring unavoidably during predetermined operations of each logic block for achieving a predetermined intended purpose.

Figure 8:
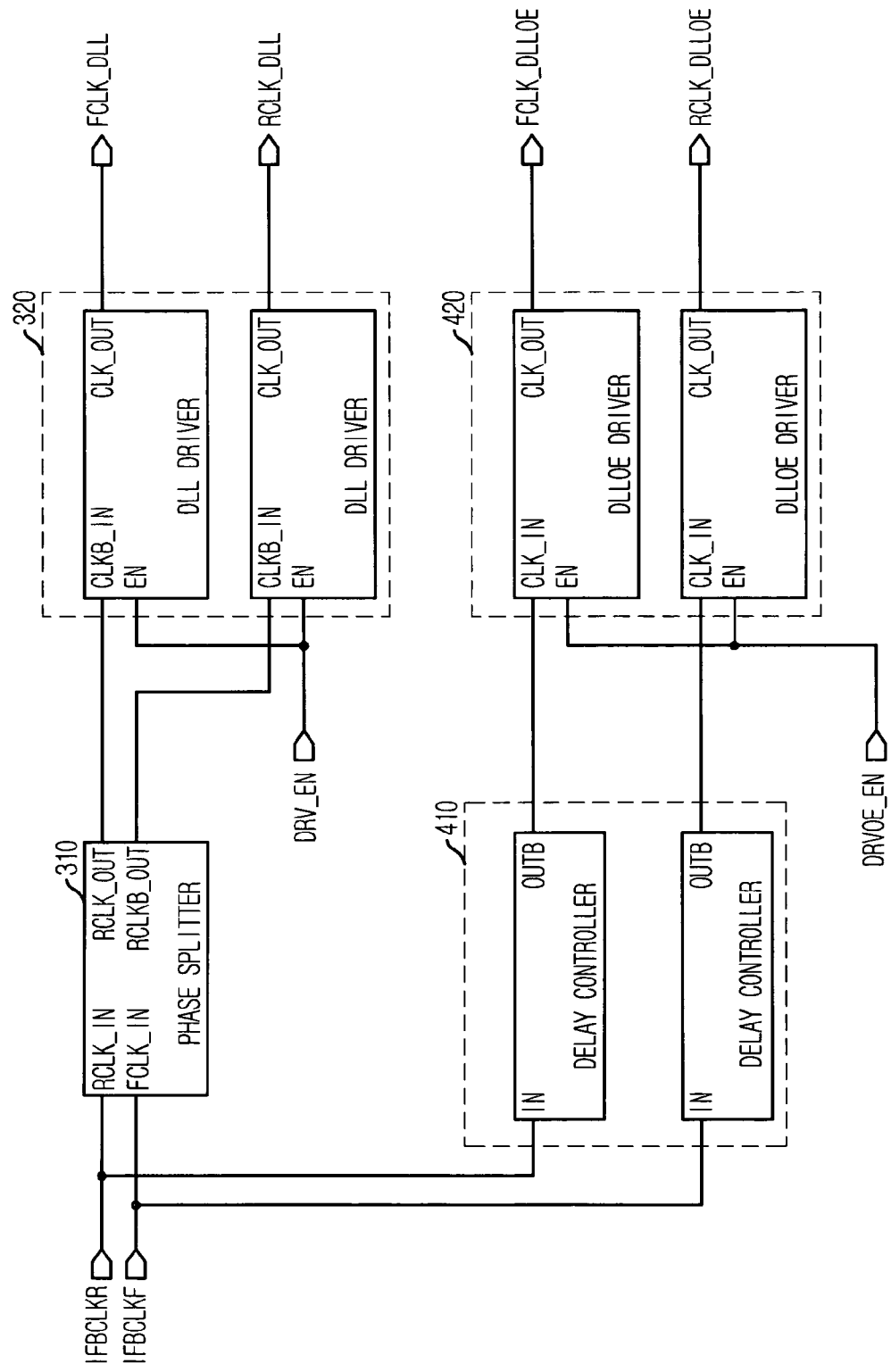
FIG. 8 is a block diagram of a driving unit having first and second driving blocks shown in FIG. 7.

FIG. 8 is a block diagram of the driving unit having the first and second driving blocks 500 and 400 shown in FIG. 7.

As shown, the first driving block 500 includes a phase splitter 310 for splitting a phase of the output from the duty cycle compensator 220 to generate two clock signals IFBCLKR and IFBCLKF having opposite phases and a first driver 320 for driving outputs of the phase splitter 310 to output as the first DLL clocks RCLK_DLL and FCLK_DLL in response to a first driving control signal DRV_EN.

The second driving block 400 includes a delay controller 410 for controlling a delay amount of the output from the duty cycle compensator 220, wherein the delay amount is smaller than an operational delay of the phase splitter 310, and a second driver 420 for driving outputs of the delay controller 410 to output as the second DLL clocks RCLK_DLLOE and FCLK_DLLOE in response to a second driving control signal DRVOE_EN.

Figure 4:
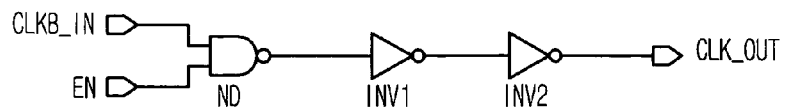
FIG. 4 is a schematic circuit diagram of a DLL driver shown in FIG. 3.
Figure 5:
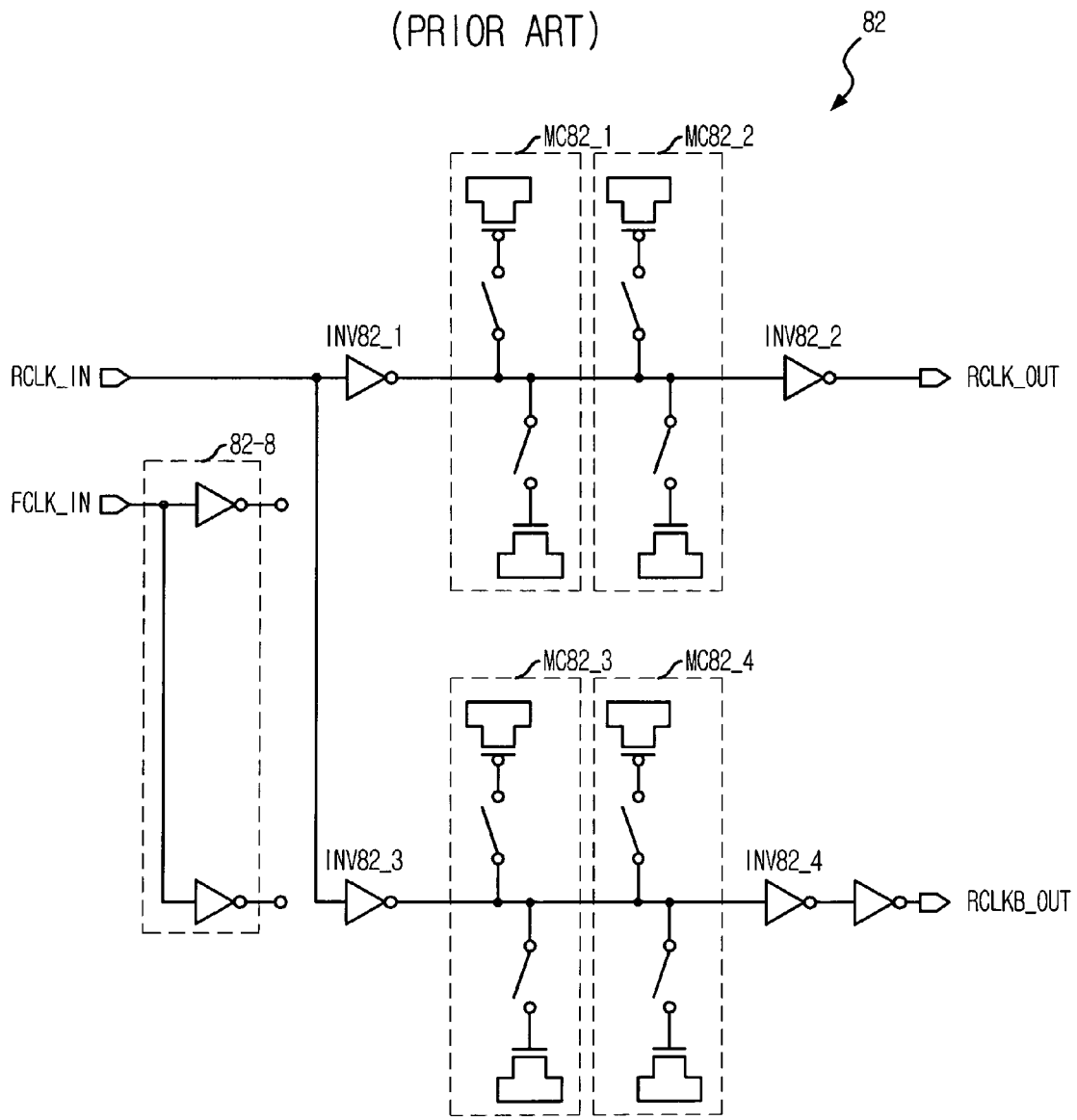
FIG. 5 is a schematic circuit diagram of a phase splitter shown in FIG. 3.
Figure 6:
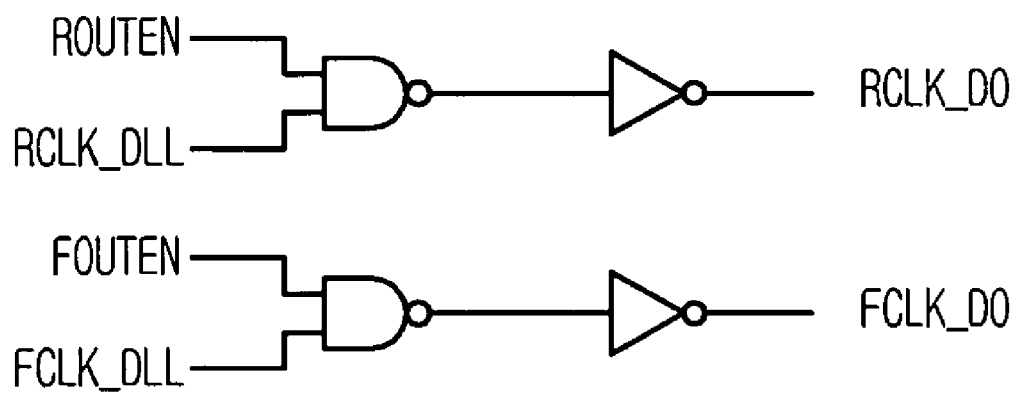
FIG. 6 is a schematic circuit diagram of a data output clock generator in a conventional semiconductor memory device.

The phase splitter 310 is similar to that depicted in FIG. 5 and the first driver 320 is also similar to that described in FIG. 4. Accordingly, detailed descriptions about the phase splitter 310 and the first driver 320 are omitted.

The delay controller 410 includes two blocks, each corresponding to each of the second DLL clocks FCLK_DLLOE and RCLK_DLLOE, and the second driver 420 is also constituted with two blocks. Receiving a rising DCC clock IFBCLKR among outputs from the duty cycle compensator 220, the delay controller 410 delay the outputs by the controlled delay amount and outputs the falling second DLL clock FCLK_DLLOE in response to the second driving control signal DRVOE_EN. Likewise, the delay controller 410 delays a falling DCC clock IFBCLKF and outputs the rising second DLL clock RCLK_DLLOE in response to the second driving control signal DRVOE_EN.

Figure 9:
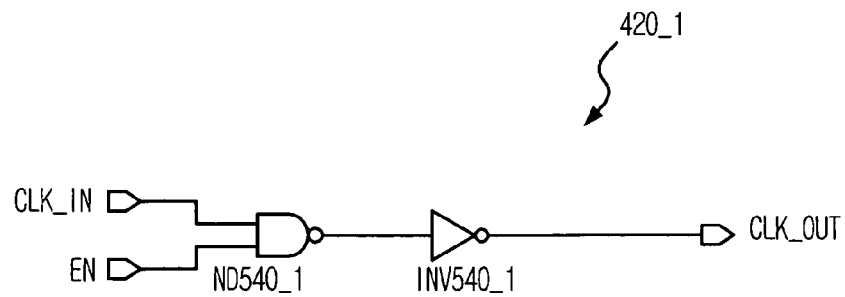
FIG. 9 is a schematic circuit diagram of a second driver shown in FIG. 8.

FIG. 9 is a schematic circuit diagram of the second driver 420 shown in FIG. 8.

One block 420_1 of the second driver 420 includes a logic NAND gate ND540_1 and at least one inverter INV540_1. As compared with FIGS. 4 and 9, each block of the first driver 320 includes two inverters, but each block of the second driver 420 includes one inverter. In detail, each block of the first driver 320 includes a logic NAND gate for performing a logic NAND operation to the first driving control signal DRV_EN and output of the phase splitter 310 and a first inverter group, constituted with an even number of inverters, for delaying output from the first NAND gate to output as the first DLL clock FCLK_DLL or RCLK_DLL. Each block of the second driver 420 includes a second NAND gate for performing a logic NAND operation to the second driving control signal DRVOE_EN and the output from the delay controller 410 and a second inverter group, constituted with an odd number of inverters fewer than the first inverter group of the first driver 320, for delaying output from the second NAND gate to output as the second DLL clock FCLK_DLLOE or RCLK_DLLOE.

Figure 10:
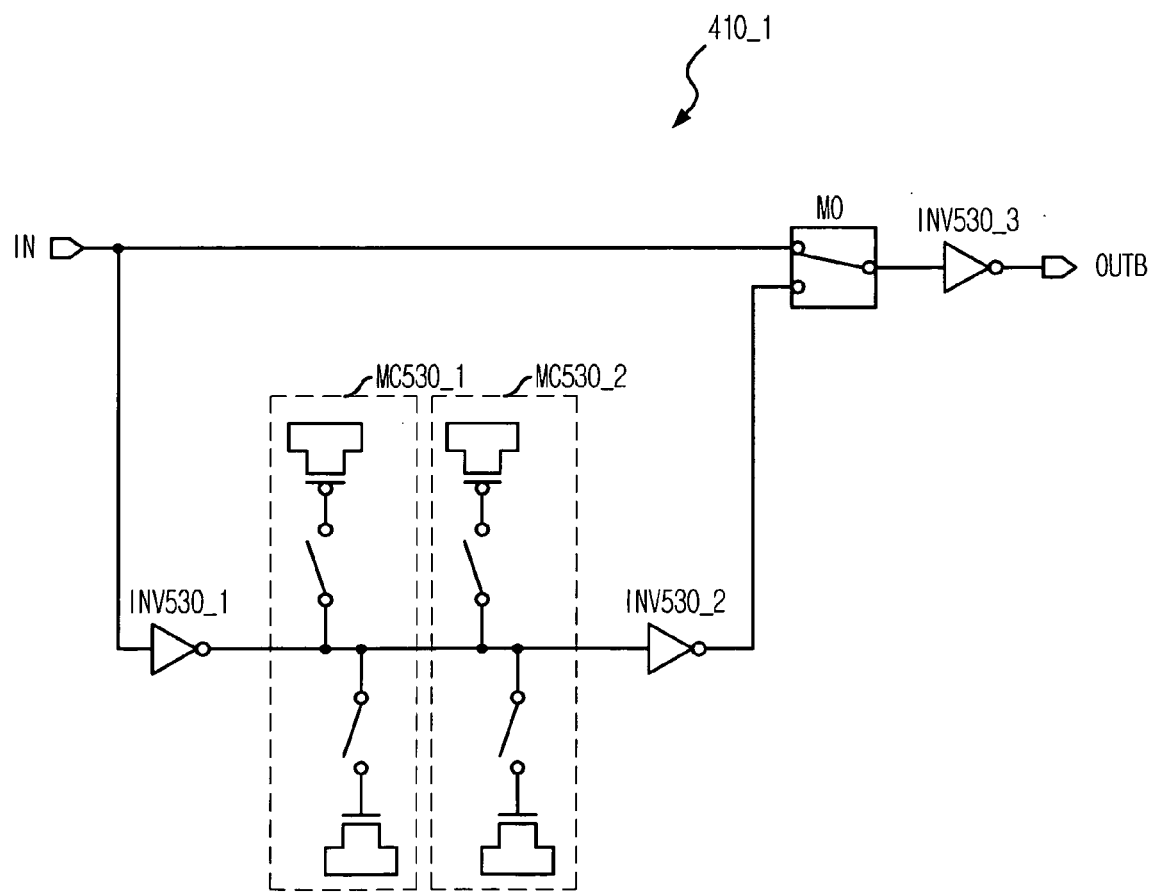
FIG. 10 is a schematic circuit diagram of a delay controller shown in FIG. 8.

FIG. 10 is a schematic circuit diagram of the delay controller 410 shown in FIG. 8.

As shown, the delay controller 410 includes delay elements INV530_1, INV530_2, MC530_1, and MC530_2, an inverter INV530_3, and an option control unit MO. Referring to FIG. 10, according to the option control unit MO, the delay controller 410 includes only one inverter INV530_3. The delay controller 410 and the phase splitter 310 includes plural delay elements constituted with inverters and MOS transistors; however, a delay amount of the delay controller 410 is controlled by the option control unit MO.

As a default, the option control unit MO does not select the delay elements including two inverters INV530_1 and INV_530_2 and two MOS capacitors MC530_1 and MC530_2. Accordingly, the delay controller 410 can have a smaller delay amount than the phase splitter 310. The input and an output of the delay controller 410 have opposite phases.

Figure 11:
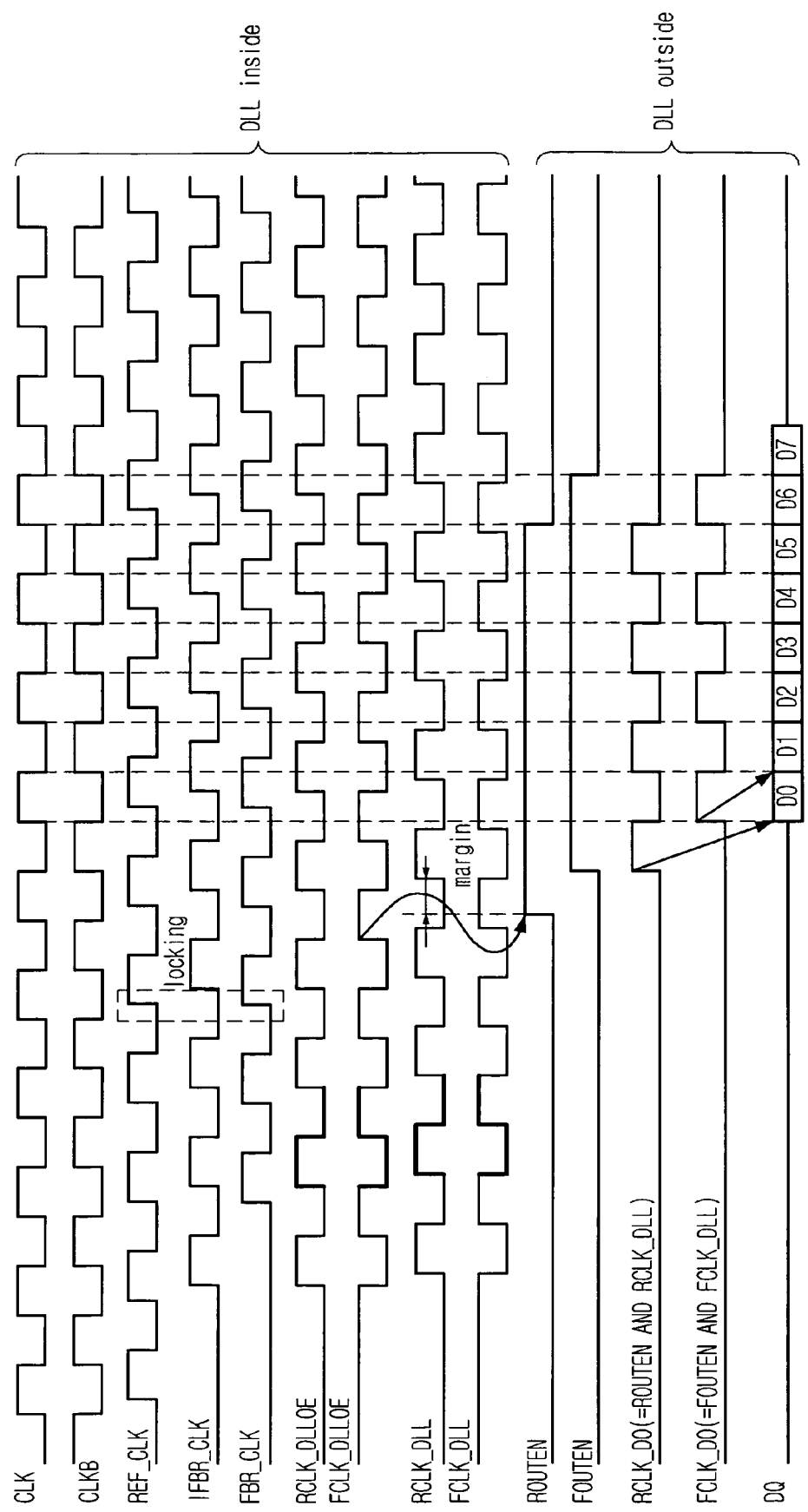
FIG. 11 is a timing diagram demonstrating operations of the delay locked loop shown in FIG. 7.

FIG. 11 is a timing diagram demonstrating operations of the delay locked loop shown in FIG. 7.

Figure 1:
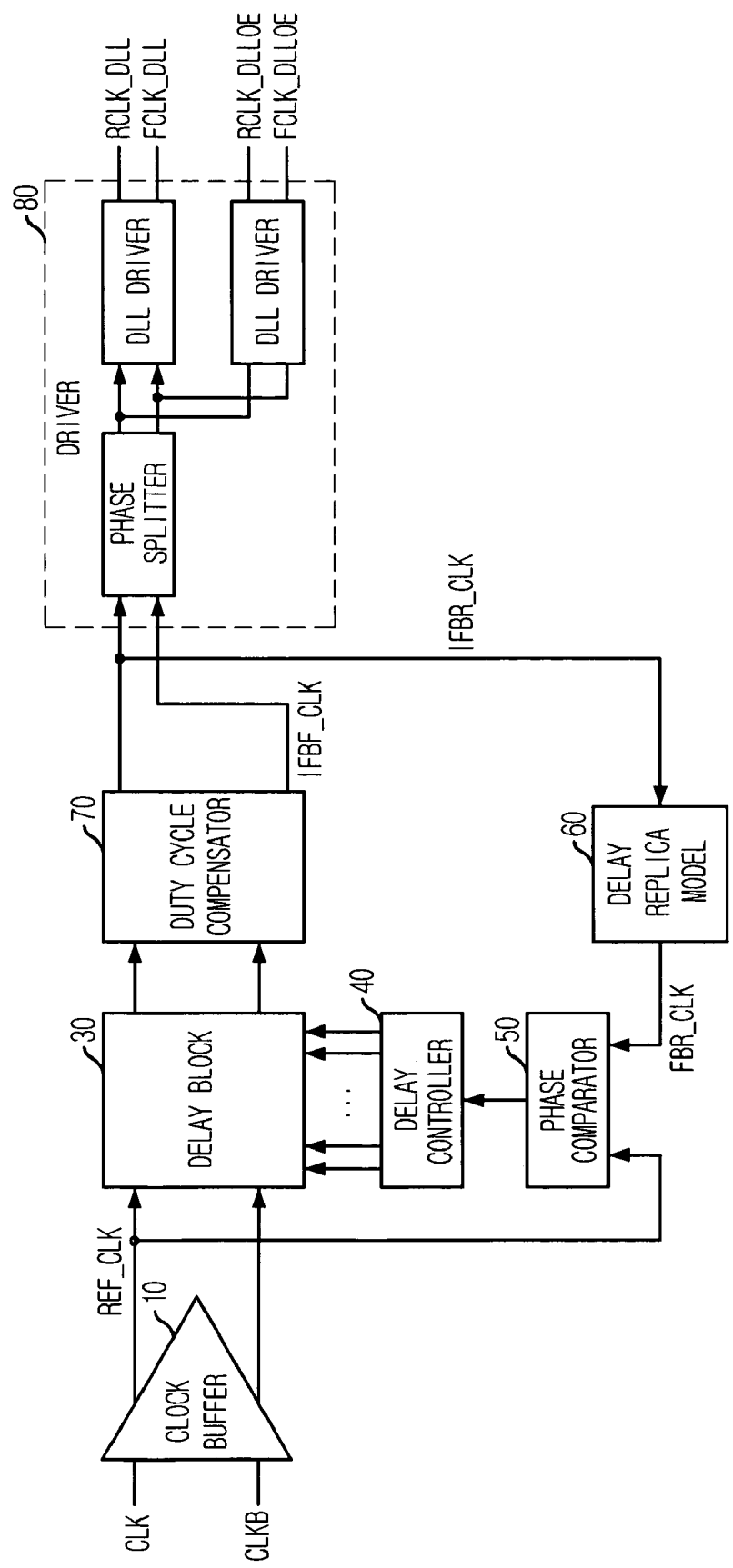
FIG. 1 is a block diagram of a conventional delay locked loop (DLL)
Figure 2:
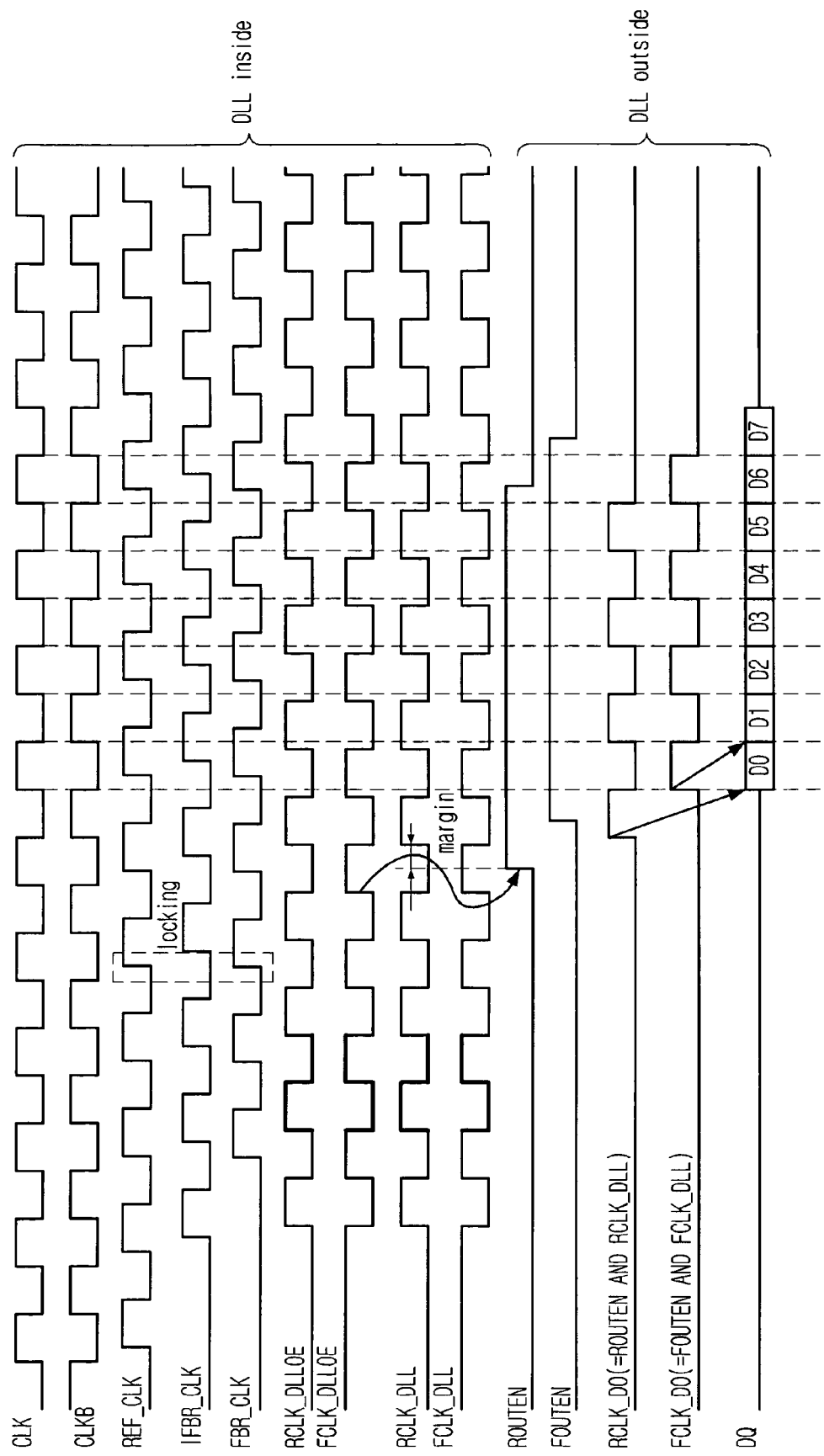
FIG. 2 is a timing diagram demonstrating operation of the conventional delay locked loop shown in FIG. 1.
Figure 3:
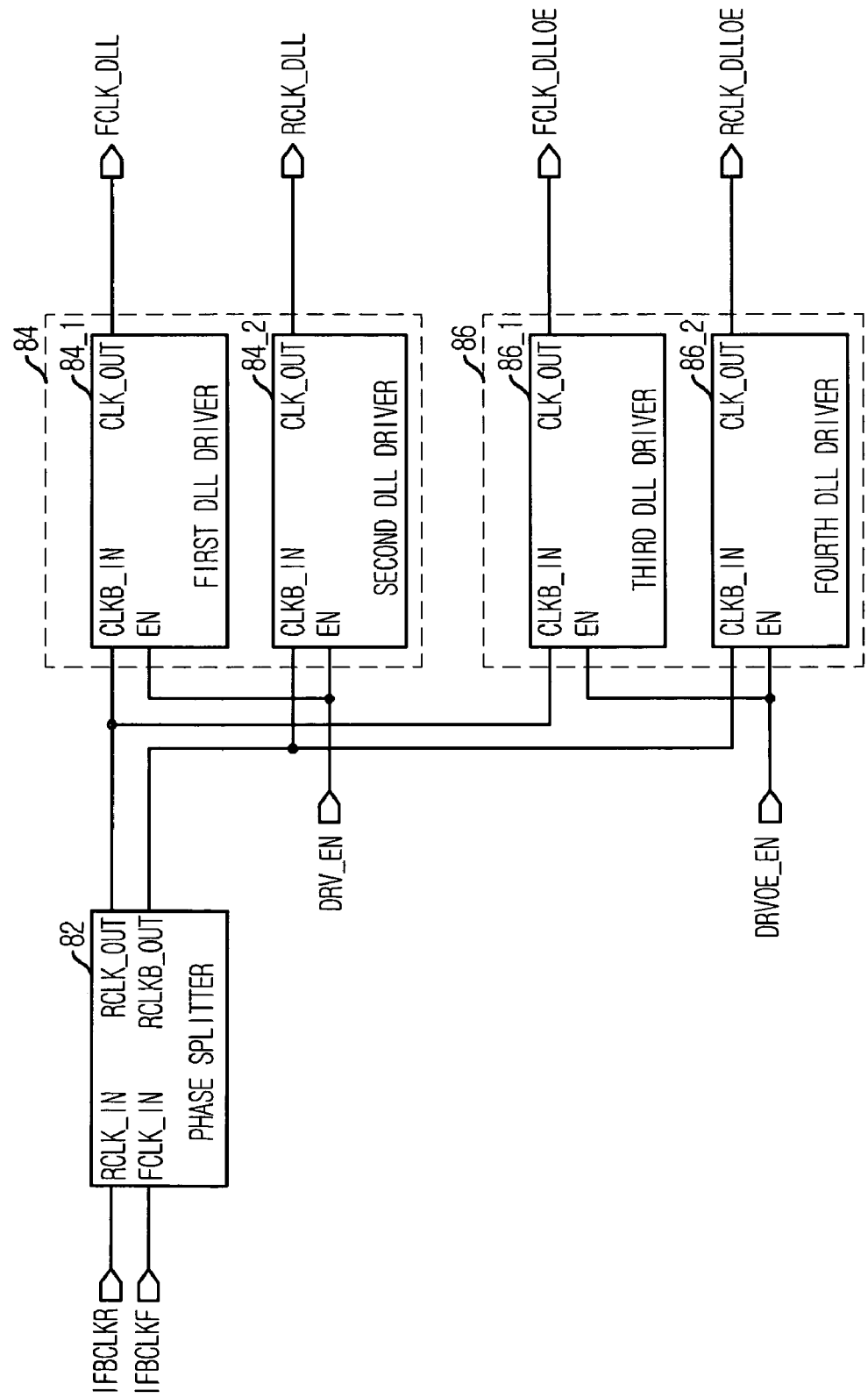
FIG. 3 is a block diagram of a driver shown in FIG. 1.

Plural signals in an inside of the delay locked loop (DLL) and plural signals in an outside of the DLL are shown. Phases of the second DLL clocks RCLK_DLLOE and FCLK_DLLOE lead those of the first DLL clocks RCLK_DLL and FCLK_DLL. Thus, the rising/falling data output enable signals ROUTEN and FOUTEN responsive to the second DLL clocks RCLK_DLLOE and FCLK_DLLOE are activated faster than the rising/falling data output enable signals ROUTEN and FOUTEN of the conventional DLL shown in FIGS. 1 and 2. Thus, a sufficient operation margin can be ensured; the delay locked loop can operate under higher operation frequency, i.e., higher frequency of an external clock CLK.

In order to overcome a deficient operation margin under a higher operation frequency, the present invention provides a delayed locked loop for supporting an increase of operation frequency in a semiconductor memory device by obtaining a sufficient operation margin for generating a data output enable signal.

The present application contains subject matter related to the Korean patent applications Nos. KR 10-2005-0090842 and KR 10-2006-0056408, filed in the Korean Patent Office on Sep. 29, 2005 and on Jun. 22, 2006 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. An output driver for use in a delay locked loop, comprising:
   a first driving block for receiving an output from the delay locked loop to generate a first DLL clock for outputting read data corresponding to a read command; and
   a second driving block for receiving an output from the delay locked loop to generate a second DLL clock for reducing current consumption during a write operation,
   wherein the first driving block has larger delay amount than the second driving block.

2. The output driver as recited in claim 1, wherein the first and second driving blocks receive the same output from the delay locked loop.

3. The output driver as recited in claim 2, wherein a phase of the second DLL clock leads that of the first DLL clock.

4. The output driver as recited in claim 3, wherein the first driving block includes:
   a phase splitter for splitting a phase of the output from the delay locked loop to generate two clock signals having opposite phases; and
   a first driver for driving outputs of the phase splitter to output as the first DLL clock.

5. The output driver as recited in claim 4, wherein the second driving block includes:
   a delay controller for controlling a delay amount of the output from the delay locked loop, wherein the delay amount is smaller than an operational delay of the phase splitter; and
   a second driver for driving outputs of the delay controller to output as the second DLL clock.

6. The output driver as recited in claim 5, wherein the second driver has smaller operational delay than the first driver.

7. The output driver as recited in claim 5, wherein the phase splitter and the delay controller include delay elements constituted with inverters and MOS transistors respectively.

8. The output driver as recited in claim 7, wherein delay controller includes only one inverter.

9. The output driver as recited in claim 5, wherein an input and an output of the delay controller have opposite phases.

10. The output driver as recited in claim 5, wherein the first driver is controlled by a first enable signal and the second driver is controlled by a second enable signal.

11. The output driver as recited in claim 10, wherein the first driver includes:
   a first NAND gate for performing a logic NAND operation to the first enable signal and the output from the phase splitter; and
   a first inverter group, comprising an even number of inverters, for delaying output from the first NAND gate to output as the first DLL clock.

12. The output driver as recited in claim 11, wherein the second driver includes:
   a second NAND gate for performing a logic NAND operation to the second enable signal and the output from the delay controller; and
   a second inverter group, comprising an odd number of inverters, fewer than the first inverter group, for delaying output from the second NAND gate to output as the second DLL clock.

13. A delay locked loop, comprising:
a clock buffer for receiving an external clock to generate an internal clock;
a phase updating block for comparing the internal clock with a feedback clock generated from the phase updating block to control a phase of the internal clock;
a first driving block for receiving an output from the phase updating block to generate a first DLL clock for outputting read data corresponding to a read command; and
a second driving block for receiving an output from the phase updating block to generate a second DLL clock for reducing current consumption during a write operation, wherein the first driving block has a larger delay amount than the second driving block.

14. The delay locked loop as recited in claim 13, wherein the phase updating block includes:
a delay line for delaying the internal clock;
a duty cycle compensator for compensating a duty ratio of output from the delay line;
a delay replica model for delaying output from the duty cycle compensator by a predetermined amount to generate the feedback clock;
a phase comparator for comparing a phase of the internal clock with that of the feedback clock;
a delay controller for controlling a delay amount of the delay line according to a result of the phase comparator.

15. The delay locked loop as recited in claim 14, wherein the first driving block includes:
a phase splitter for splitting a phase of the output from the duty cycle compensator to generate two clock signals having opposite phases; and
a first driver for driving outputs of the phase splitter to output as the first DLL clock.

16. The delay locked loop as recited in claim 15, wherein the second driving block includes:
a delay controller for controlling a delay amount of the output from the duty cycle compensator, wherein the delay amount is smaller than an operational delay of the phase splitter; and
a second driver for driving outputs of the delay controller to output as the second DLL clock.

17. The delay locked loop as recited in claim 16, wherein the second driver has a smaller operational delay than the first driver.

18. The delay locked loop as recited in claim 16, wherein the phase splitter and the delay controller include delay elements comprising inverters and MOS transistors respectively.

19. The delay locked loop as recited in claim 18, wherein the delay controller includes only one inverter.

20. The delay locked loop as recited in claim 16, wherein an input and an output of the delay controller have opposite phases.

21. The delay locked loop as recited in claim 16, wherein the first driver is controlled by a first enable signal and the second driver is controlled by a second enable signal.

22. The delay locked loop as recited in claim 21, wherein the first driver includes:
a first NAND gate for performing a logic NAND operation to the first enable signal and the output from the phase splitter; and
a first inverter group, comprising an even number of inverters, for delaying output from the first NAND gate to output as the first DLL clock.

23. The delay locked loop as recited in claim 22, wherein the second driver includes:
a second NAND gate for performing a logic NAND operation to the second enable signal and the output from the delay controller; and
a second inverter group, comprising an odd number of inverters fewer than the first inverter group, for delaying output from the second NAND gate to output as the second DLL clock.

24. A semiconductor device, comprising:
a first driving block for splitting a phase of a first input signal to generate plural first internal signals, each having different phases with respect to each other, and outputting the plural first internal signals in response to a first control signal; and
a second driving block for delaying a second input signal and outputting the delayed signal in response to a second control signal.

25. The semiconductor device as recited in claim 24, wherein the first input signal is the same as the second input signal.

26. The semiconductor device as recited in claim 25, wherein the first driving block includes:
a phase splitter for splitting a phase of the first input signal to generate two first internal signals having opposite phase with respect to each other; and
a first driver for outputting outputs of the phase splitter in response to the first control signal.

27. The semiconductor device as recited in claim 26, wherein the second driving block includes:
a delay controller for delaying the second input signal by a predetermined delay amount which is smaller than an operational delay of the phase splitter; and
a second driver for outputting output of the delay controller in response to the second control signal.

28. The semiconductor device as recited in claim 27, wherein the second input signal includes two signals having opposite phases and the delay controller outputs inversed signals of the input signals.

29. The semiconductor device as recited in claim 27, wherein the second driver has a smaller operational delay than the first driver.

30. The semiconductor device as recited in claim 29, wherein the phase splitter and the delay controller include delay elements comprising inverters and MOS transistors respectively.

* * * * *